(12) United States Patent
Zheng

(10) Patent No.: US 10,795,484 B2
(45) Date of Patent: Oct. 6, 2020

(54) FORCE TOUCH STRUCTURE AND DISPLAY DEVICE

(71) Applicant: BOE TECHNOLOGY GROUP CO., LTD., Beijing (CN)

(72) Inventor: Meizhu Zheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/982,015

(22) Filed: May 17, 2018

(65) Prior Publication Data
US 2019/0064988 A1 Feb. 28, 2019

(30) Foreign Application Priority Data

Aug. 28, 2017 (CN) .......................... 2017 1 0749513

(51) Int. Cl.
| | |
|---|---|
| G06F 3/041 | (2006.01) |
| H01L 33/64 | (2010.01) |
| H05K 1/18 | (2006.01) |
| G06F 3/044 | (2006.01) |

(52) U.S. Cl.
CPC ............ G06F 3/0414 (2013.01); G06F 3/041 (2013.01); G06F 3/0412 (2013.01); H01L 33/64 (2013.01); H05K 1/189 (2013.01); G06F 3/044 (2013.01); G06F 2203/04105 (2013.01)

(58) Field of Classification Search
CPC ....... G06F 3/0414; G06F 3/041; G06F 3/0412
USPC ........................................................ 345/173
See application file for complete search history.

(56) References Cited

U.S. PATENT DOCUMENTS

| | | | | | |
|---|---|---|---|---|---|
| 5,511,428 | A | * | 4/1996 | Goldberg ............. | B81B 7/0061 257/417 |
| 6,968,744 | B1 | * | 11/2005 | Silverbrook ........ | B60C 23/0408 73/718 |
| 7,124,640 | B1 | * | 10/2006 | Miller .................... | G01L 19/04 73/708 |
| 7,165,460 | B2 | * | 1/2007 | Silverbrook .......... | G01L 9/0072 73/729.2 |
| 7,353,713 | B2 | * | 4/2008 | Harish ................... | G01L 1/142 73/780 |
| 7,880,600 | B2 | * | 2/2011 | Forster ............... | B60C 23/0433 340/442 |
| 8,966,989 | B2 | * | 3/2015 | Drewes ............... | G01L 9/0075 73/718 |
| 9,423,309 | B2 | | 8/2016 | Kuniyoshi et al. | |
| 9,816,887 | B2 | * | 11/2017 | Berlinger ............. | C04B 35/111 |
| 9,927,315 | B2 | * | 3/2018 | Hanselmann-Willi ...... G01L 9/0072 |

(Continued)

FOREIGN PATENT DOCUMENTS

| | | |
|---|---|---|
| CN | 101025496 A | 8/2007 |
| CN | 102944352 A | 2/2013 |

(Continued)

OTHER PUBLICATIONS

First Office Action for Chinese Application No. 201710749513.6, dated Nov. 4, 2019, 8 Pages.

*Primary Examiner* — Fred Tzeng
(74) *Attorney, Agent, or Firm* — Brooks Kushman P.C.

(57) ABSTRACT

The present disclosure provides a force touch structure and a display device. The force touch structure includes a force sensor and a reference layer. A capacitor is formed between the force sensor and the reference layer, the force sensor includes a first pattern layer and a second pattern layer, and the second pattern layer includes a heat dissipation structure.

18 Claims, 2 Drawing Sheets

(56) References Cited

U.S. PATENT DOCUMENTS

| | | | |
|---|---|---|---|
| 10,048,149 B2* | 8/2018 | Rupp | G01L 9/0075 |
| 10,101,232 B2* | 10/2018 | Tham | G01L 13/026 |
| 10,234,340 B2* | 3/2019 | Severinkangas | G01L 1/146 |
| 2002/0193817 A1* | 12/2002 | Lal | A61F 9/00745 |
| | | | 606/169 |
| 2006/0070447 A1* | 4/2006 | Agami | G01L 19/04 |
| | | | 73/708 |
| 2006/0278580 A1* | 12/2006 | Striemer | B01D 61/18 |
| | | | 210/650 |
| 2007/0062295 A1* | 3/2007 | Silverbrook | G01L 9/0042 |
| | | | 73/729.2 |
| 2007/0091013 A1* | 4/2007 | Pak | G02F 1/13338 |
| | | | 345/50 |
| 2007/0195032 A1 | 8/2007 | Lee et al. | |
| 2008/0110270 A1* | 5/2008 | Silverbrook | B60C 23/0408 |
| | | | 73/724 |
| 2009/0105380 A1* | 4/2009 | Neill | B32B 27/36 |
| | | | 524/100 |
| 2012/0228109 A1* | 9/2012 | Wang | H01G 5/16 |
| | | | 200/600 |
| 2013/0005372 A1* | 1/2013 | Strei | F28D 15/0275 |
| | | | 455/500 |
| 2013/0082345 A1* | 4/2013 | Corcos | G01J 5/0837 |
| | | | 257/467 |
| 2013/0327151 A1* | 12/2013 | Berlinger | G01L 9/0075 |
| | | | 73/756 |
| 2015/0346044 A1* | 12/2015 | Mullis | G01L 9/0045 |
| | | | 73/724 |
| 2016/0162093 A1 | 6/2016 | Kim et al. | |
| 2016/0283006 A1 | 9/2016 | Ogura et al. | |
| 2016/0341623 A1* | 11/2016 | Paulitsch | G01L 9/0072 |
| 2017/0212613 A1* | 7/2017 | Hwang | G06F 3/041 |
| 2017/0269758 A1 | 9/2017 | Wen et al. | |

FOREIGN PATENT DOCUMENTS

| | | |
|---|---|---|
| CN | 105446538 A | 3/2016 |
| CN | 106527809 A | 3/2017 |
| CN | 107003771 A | 8/2017 |

* cited by examiner

FORCE TOUCH STRUCTURE AND DISPLAY DEVICE

CROSS-REFERENCE TO RELATED APPLICATION

This application claims priority to Chinese Patent Application No. 201710749513.6 filed on Aug. 28, 2017, which is incorporated herein by reference in its entirety.

TECHNICAL FIELD

The present disclosure relates to the field of display technology, in particular to a force touch structure and a display device.

BACKGROUND

Along with the development of the touch technology, capacitive force touch technique has been widely used in a display device. For the display device with a capacitive force touch structure, it is able to trigger different control functions through adjusting a magnitude of a touch force.

A conventional capacitive force touch structure includes a force sensor, a reference layer and an isolation layer arranged between the force sensor and the reference layer. The reference layer is grounded, and a capacitor is formed between the force sensor and the reference layer.

SUMMARY

In one aspect, the present disclosure provides in some embodiments a force touch structure, including a force sensor and a reference layer. A capacitor is formed between the force sensor and the reference layer, the force sensor includes a first pattern layer and a second pattern layer, and the second pattern layer includes a heat dissipation structure.

In a possible embodiment of the present disclosure, the force sensor further includes a base film, the first pattern layer is arranged at one side of the base film, and the second pattern layer is arranged at the other side of the base film.

In a possible embodiment of the present disclosure, a spacer layer is further arranged between the force sensor and the reference layer, and the second pattern layer is arranged at a side of the spacer layer away from the reference layer.

In a possible embodiment of the present disclosure, the force touch structure overlaps with a whole display panel, the display panel includes a display region and a peripheral region surrounding the display region, the heat dissipation structure of the second pattern layer overlaps with the display region, and the pattern structure of the second pattern layer overlaps with the peripheral region.

In a possible embodiment of the present disclosure, the heat dissipation structure is a plane-like structure.

In a possible embodiment of the present disclosure, the heat dissipation structure is made of copper.

In a possible embodiment of the present disclosure, the reference layer is grounded.

In a possible embodiment of the present disclosure, the heat dissipation structure has a thickness ranging from 12 µm to 15 µm.

In a possible embodiment of the present disclosure, the force sensor further includes a first protection layer arranged at a side of the first pattern layer away from the second pattern layer.

In a possible embodiment of the present disclosure, the first protection layer is a halogen-free polyimide membrane.

In a possible embodiment of the present disclosure, the force sensor is a flexible printed circuit, the first pattern layer includes a circuit structure, the pattern structure of the second pattern layer is a circuit structure including a force touch line at a position corresponding to the peripheral region of the display panel.

In a possible embodiment of the present disclosure, the force sensor further includes a protection structure arranged at a side of the second pattern layer away from the first pattern layer and merely covering the pattern structure of the second pattern layer rather than the heat dissipation structure.

In another aspect, the present disclosure further provides in some embodiments a display device, including a display panel and the above-mentioned force touch structure. The force touch structure is arranged at a back surface of the display panel, and the back surface is arranged opposite to a light-emitting surface of the display panel.

In a possible embodiment of the present disclosure, the second pattern layer is arranged at a side of the first pattern layer away from the display panel.

In a possible embodiment of the present disclosure, the display device further includes a membrane made of silicon nitride and arranged between the display panel and the force sensor.

In a possible embodiment of the present disclosure, the display device further includes a second protection layer arranged at a side of a touch structure away from the display panel.

DETAILED DESCRIPTION

The present disclosure will be described hereinafter in conjunction with the drawings and embodiments.

In the related art, a capacitive force touch structure includes a force sensor, a reference layer and an isolation layer arranged between the force sensor and the reference layer. The reference layer is grounded, and a capacitor is formed between the force sensor and the reference layer. The capacitive force touch structure further includes a heat dissipation structure made of copper (Cu) for heat dissipation. The heat dissipation structure is provided individually in the capacitive force touch structure. A force touch effect of the capacitive force touch structure may be adversely affected due to an uneven surface of the heat dissipation structure. In addition, an additional attaching process needs to be provided for the individual heat dissipation structure, and meanwhile the manufacture cost thereof may increase.

The present disclosure is to provide a force touch structure and a display device to improve the force touch effect and reduce the manufacture cost.

Figure 1:
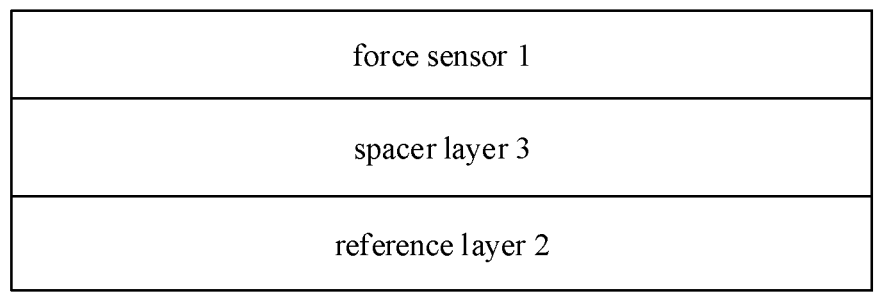
FIG. 1 is a schematic view showing a force touch structure according to some embodiments of the present disclosure.
Figure 2:
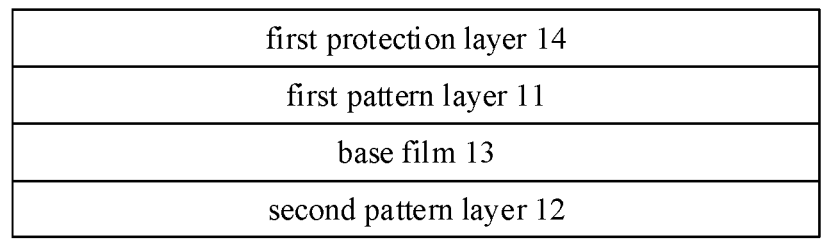
FIG. 2 is a schematic view showing a force sensor in FIG. 1.

FIG. 1 is a schematic view showing a force touch structure according to some embodiments of the present disclosure. FIG. 2 is a schematic view showing a force sensor in FIG. 1. As shown in FIGS. 1 and 2, the force touch structure includes a force sensor 1 and a reference layer 2. A capacitor is formed between the force sensor 1 and the reference layer 2, the force sensor 1 includes a first pattern layer 11 and a second pattern layer 12, and the second pattern layer 12 includes a heat dissipation structure.

The force touch structure in the embodiments of the present disclosure may be applied to a display device with a battery, and the heat dissipation structure may be used for the heat dissipation of the battery.

Figure 4:
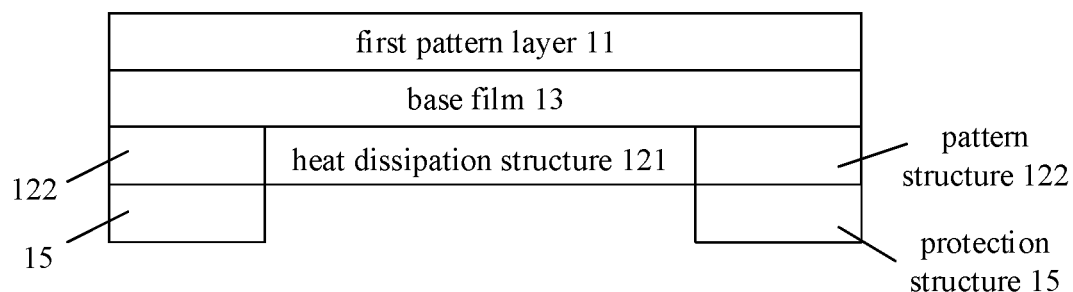
FIG. 4 is a schematic view showing the force sensor according to some embodiments of the present disclosure.

The second pattern layer 12 further includes a pattern structure surrounding the heat dissipation structure. In a possible embodiment of the present disclosure, the force touch structure corresponds to a display panel. To be specific, the force touch structure corresponds to a portion of the display panel or the whole display panel. The display panel includes a display region and a peripheral region surrounding the display region. In the case that the force touch structure corresponds to the whole display panel, the heat dissipation structure corresponds to the display region of the display panel, and the pattern structure corresponds to the peripheral region of the display panel. It should be appreciated that, FIGS. 1 and 2 merely show the second pattern layer 12, but fail to show the pattern structure and the heat dissipation structure. FIG. 4 shows the pattern structure and the heat dissipation structure of the second pattern layer in the case that the force touch structure corresponds to the whole display panel. As shown in FIG. 4, the second pattern layer 12 includes the heat dissipation structure 121 located centrally and the pattern structure 122 surrounding the heat dissipation structure 121. Of course, positions of the heat dissipation structure 121 and the pattern structure 122 may not be limited thereto.

In some optional embodiments of the present disclosure, the force sensor 1 further includes a base film 13, the first pattern layer 11 is arranged at one side of the base film 13, and the second pattern layer is arranged at the other side of the base film 13. For example, the base film 13 may be made of polyimide (PI). The force sensor 1 may be a flexible printed circuit (FPC), and at this time, the first pattern layer 11 includes a circuit structure, and the pattern structure of the second pattern layer is a circuit structure. The circuit structure of the first pattern layer 11 includes a force touch line, and the circuit structure of the second pattern layer includes a force touch line corresponding to the peripheral region of the display panel. In the embodiments of the present disclosure, the heat dissipation structure is a part of the second pattern layer of the FPC. In the related art, the portion of the FPC corresponding to the heat dissipation layer may be etched off. However, in the embodiments of the present disclosure, this portion is used as the heat dissipation structure, so it is able to reduce the manufacture cost.

In some optional embodiments of the present disclosure, as shown in FIG. 4, the force sensor 1 further includes a protection structure 15 arranged at a side of the second pattern layer 12 away from the first pattern layer 11 and covering the pattern structure 122 of the second pattern layer 12. The protection structure 15 is located on the pattern structure 122 rather than the heat dissipation structure 121 of the second pattern layer 12, i.e., it does not cover the heat dissipation structure 121. Through the protection structure 15, it is able to prevent the pattern structure from being curled upward. As compared with the related art where a protection layer is formed on the entire second pattern layer, in the embodiments of the present disclosure, the protection structure 15 is located on the pattern structure 122 rather than the heat dissipation structure 121 of the second pattern layer 12, so it is able to achieve a better heat dissipation effect through the heat dissipation structure 121 while preventing the pattern structure 122 from being curled upward.

A spacer layer 3 is further arranged between the force sensor 1 and the reference layer 2, and the second pattern layer is arranged at a side of the spacer layer 3 away from the reference layer 2. In some optional embodiments of the present disclosure, the spacer layer 3 is made of a soft insulation material, e.g., foam.

In some optional embodiments of the present disclosure, the reference layer 2 may be grounded and have a mid-frame structure. The mid-frame structure may function as a support in the display device, and after it has been grounded, it may also be configured to shield interference. In some optional embodiments of the present disclosure, the mid-frame structure may be made of metal.

In the case that a force is applied to the force touch structure, the spacer layer 3 between the force sensor 1 and the reference layer 2 may be deformed, so a distance between the force sensor 1 and the reference layer 2 may change. At this time, a capacitance of the capacitor formed between the force sensor 1 and the reference layer 2 may change too. A force touch signal may be generated by detecting the change in the capacitance of the capacitor, and a touch force amplitude signal may be generated in accordance with the force touch signal. Through the touch force amplitude signals, it is able to trigger different control functions.

In some optional embodiments of the present disclosure, the heat dissipation structure 121 is of a plane-like structure, so as to achieve the heat dissipation function in a better manner.

The heat dissipation structure 121 may be made of metal. In some optional embodiments of the present disclosure, each of the heat dissipation structure 121 and the second pattern layer 12 may be made of copper. In this way, it is able to, on one hand, form the heat dissipation structure and the second pattern layer simultaneously, and on the other hand, achieve the heat dissipation function in a better manner.

The heat dissipation structure 121 has a thickness of 12 µm to 15 µm. In some optional embodiments of the present disclosure, the heat dissipation structure 121 may have a thickness of 15 µm, so as to acquire a better heat dissipation effect.

In some optional embodiments of the present disclosure, the force sensor 1 further includes a first protection layer 14 arranged at a side of the first pattern layer 11 away from the second pattern layer 12. The first protection layer 14 may be a halogen-free polyimide membrane.

According to the force touch structure in the embodiments of the present disclosure, the force sensor includes the first pattern layer and the second pattern layer, and the second pattern layer includes the heat dissipation structure, so it is unnecessary to provide the heat dissipation structure with an uneven surface individually, thereby to improve the force touch effect. In addition, it is unnecessary to provide an additional attaching process for the individual heat dissipation structure, thereby to reduce the manufacture cost.

Figure 3:
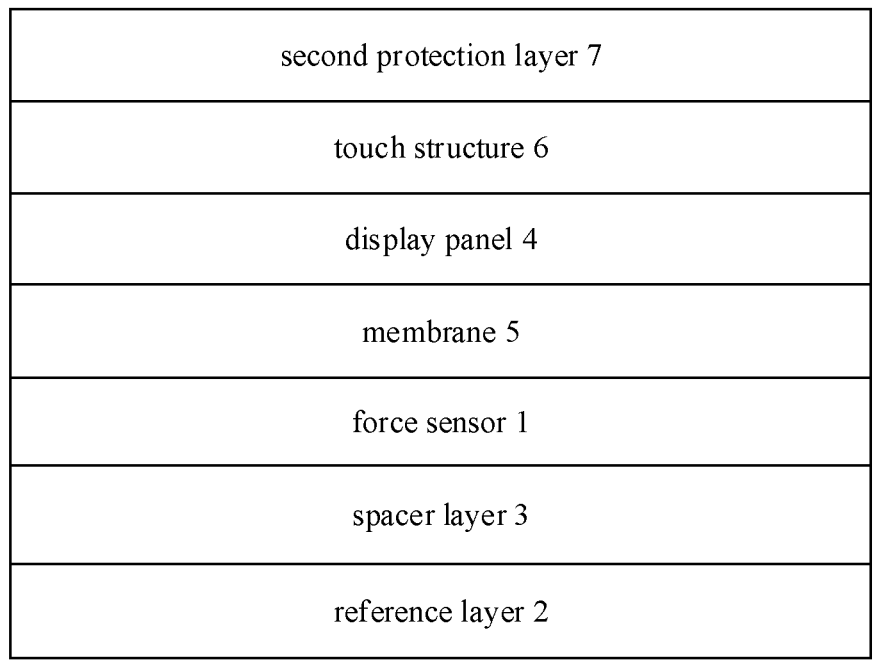
FIG. 3 is a schematic view showing a display device according to some other embodiments of the present disclosure.

The present disclosure further provides in some embodiments a display device which, as shown in FIG. 3, includes a display panel 4 and a force touch structure. The force touch structure is arranged at a back surface of the display panel 4, and the back surface is arranged opposite to a light-emitting surface of the display panel 4. The implementation of the force touch structure may refer to that mentioned hereinabove, and thus will not be particularly defined herein. The display device may be a flexible display device.

In some optional embodiments of the present disclosure, the display device further includes a membrane 5 arranged between the display panel 4 and the force sensor 1 and serving as a support. The membrane 5 may be made of silicon nitride.

In some optional embodiments of the present disclosure, the display device further includes a touch structure 6 arranged at a side of the display panel 4 away from the force sensor 1. The touch structure 6 may be a touch screen panel (TSP), e.g., a two-dimensional (2D) TSP.

In some optional embodiments of the present disclosure, the display device further includes a second protection layer 7 arranged at a side of the touch structure 6 away from the display panel 4. The second protection layer 7 may be made of an over coating material, e.g., silicon nitride or silicon oxide.

To be specific, the spacer layer 3, the force sensor 1, the membrane 5, the display panel 4, the touch structure 6 and the second protection layer are sequentially arranged on the reference layer 2.

As shown in FIGS. 2 and 3, the second pattern layer of the force sensor 1 is arranged at a side of the first pattern layer 11 away from the display panel 4. To be specific, the base film 13 is arranged on the second pattern layer 12, i.e., on the heat dissipation structure 121. The second pattern layer 12, the base film 13, the first pattern layer 11, the first protection layer 14 and the membrane 5 are stacked one on another.

According to the display device in the embodiments of the present disclosure, the force sensor includes the first pattern layer and the second pattern layer, and the second pattern layer includes the heat dissipation structure, so it is unnecessary to provide the heat dissipation structure with an uneven surface individually, thereby to improve the force touch effect. In addition, it is unnecessary to provide an additional attaching process for the individual heat dissipation structure, thereby to reduce the manufacture cost.

The above are merely optional embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display device, comprising a display panel and a force touch structure, wherein the force touch structure is arranged at a back surface of the display panel, and the back surface is arranged opposite to a light-emitting surface of the display panel, wherein the force touch structure comprises a force sensor and a reference layer, a capacitor is formed between the force sensor and the reference layer, the force sensor comprises a first pattern layer and a second pattern layer, and the second pattern layer comprises a heat dissipation structure; and
wherein the force sensor further comprises a first protection layer arranged at a side of the first pattern layer away from the second pattern layer, and the first protection layer is a halogen-free polyimide membrane.

2. The display device according to claim 1, wherein the force sensor further comprises a base film, the first pattern layer is arranged at one side of the base film, and the second pattern layer is arranged at the other side of the base film, wherein the force touch structure further comprises a spacer layer arranged between the force sensor and the reference layer, and wherein the second pattern layer is arranged at a side of the spacer layer away from the reference layer.

3. The display device according to claim 1, wherein the second pattern layer further comprises a pattern structure, the force touch structure overlaps with a whole display panel, the display panel comprises a display region and a peripheral region surrounding the display region, the heat dissipation structure of the second pattern layer overlaps with the display region, and the pattern structure of the second pattern layer overlaps with the peripheral region.

4. The display device according to claim 3, wherein the force sensor is a flexible printed circuit, the first pattern layer comprises a circuit structure, the pattern structure of the second pattern layer is a circuit structure comprising a force touch line at a position corresponding to the peripheral region of the display panel.

5. The display device according to claim 1, wherein each of the heat dissipation structure and the second pattern layer is made of copper.

6. The display device according to claim 1, wherein the second pattern layer is arranged at a side of the first pattern layer away from the display panel.

7. The display device according to claim 1, further comprising:
a membrane made of silicon nitride and arranged between the display panel and the force sensor; and
a second protection layer arranged at a side of a touch structure away from the display panel.

8. A force touch structure, comprising a force sensor and a reference layer, wherein a capacitor is formed between the force sensor and the reference layer, the force sensor comprises a first pattern layer and a second pattern layer, and the second pattern layer comprises a heat dissipation structure,
wherein the force sensor further comprises a first protection layer arranged at a side of the first pattern layer away from the second pattern layer, and the first protection layer is a halogen-free polyimide membrane.

9. The force touch structure according to claim 8, wherein the force sensor further comprises a base film, the first pattern layer is arranged at one side of the base film, and the second pattern layer is arranged at the other side of the base film.

10. The force touch structure according to claim 8, further comprising a spacer layer arranged between the force sensor and the reference layer, wherein the second pattern layer is arranged at a side of the spacer layer away from the reference layer.

11. The force touch structure according to claim 8, wherein the second pattern layer further comprises pattern structure, the force touch structure overlaps with a whole display panel, the display panel comprises a display region and a peripheral region surrounding the display region, the heat dissipation structure of the second pattern layer overlaps with the display region, and the pattern structure of the second pattern layer overlaps with the peripheral region.

12. The force touch structure according to claim 11, wherein the force sensor is a flexible printed circuit, the first pattern layer comprises a circuit structure, the pattern structure of the second pattern layer is a circuit structure comprising a force touch line at a position corresponding to the peripheral region of the display panel.

13. The force touch structure according to claim 8, wherein the heat dissipation structure is of a plane-like structure.

14. The force touch structure according to claim 8, wherein each of the heat dissipation structure and the second pattern layer is made of copper.

15. The force touch structure according to claim 8, wherein the reference layer is grounded.

16. The force touch structure according to claim 15, wherein the heat dissipation structure has a thickness ranging from 12 µm to 15 µm.

17. The force touch structure according to claim 8, wherein the force sensor further comprises a protection structure arranged at a side of the second pattern layer away from the first pattern layer and merely covering the pattern structure of the second pattern layer rather than the heat dissipation structure.

18. A force touch structure, comprising a force sensor and a reference layer, wherein a capacitor is formed between the force sensor and the reference layer, the force sensor comprises a first pattern layer and a second pattern layer, and the second pattern layer comprises a heat dissipation structure;
 wherein the second pattern layer further comprises a pattern structure, the force touch structure overlaps with a whole display panel, the display panel comprises a display region and a peripheral region surrounding the display region, the heat dissipation structure of the second pattern layer overlaps with the display region, and the pattern structure of the second pattern layer overlaps with the peripheral region; and
 wherein the force sensor is a flexible printed circuit, the first pattern layer comprises a circuit structure, the pattern structure of the second pattern layer is a circuit structure comprising a force touch line at a position corresponding to the peripheral region of the display panel.

\* \* \* \* \*